United States Patent

Coppens et al.

[11] Patent Number: 5,795,697
[45] Date of Patent: Aug. 18, 1998

[54] IMAGING ELEMENT FOR MAKING AN IMPROVED PRINTING PLATE ACCORDING TO THE SILVER SALT DIFFUSION TRANSFER PROCESS

[75] Inventors: Paul Coppens, Turnhout; Eric Hoes, Lille, both of Belgium

[73] Assignee: AGFA-Gevart, N.V., Mortsel, Belgium

[21] Appl. No.: 888,290

[22] Filed: Jul. 3, 1997

Related U.S. Application Data

[60] Provisional application No. 60/026,778, Sep. 20, 1996.

[30] Foreign Application Priority Data

Jul. 4, 1996 [EP] European Pat. Off. ............ 96201910

[51] Int. Cl.$^6$ .............. G03C 8/52; G03C 8/06; G03F 7/07
[52] U.S. Cl. ............. 430/204; 430/207; 430/227; 430/727; 430/537; 430/539; 430/950; 430/961
[58] Field of Search ............... 43/204, 207, 227, 43/950, 961, 537, 539

[56] References Cited

U.S. PATENT DOCUMENTS

5,620,830  4/1997  Coppens et al. ............... 430/204

*Primary Examiner*—Richard L. Schilling
*Attorney, Agent, or Firm*—Breiner & Breiner

[57] ABSTRACT

The present invention provides an imaging element comprising in the order given on a hydrophilic surface of a support (i) an image receiving layer containing physical development nuclei, (ii) a photosensitive layer containing a silver halide emulsion being in water permeable relationship with said image receiving layer (iii) a first antistress layer and (iv) a second antistress layer, said antistress layers being in water permeable relationship with said image receiving layer and each independently comprising unhardened gelatin, characterized in that said second antistress layer comprises at least 30 mg/m$^2$ of a matting agent with a weight average diameter of more than 3 μm.

10 Claims, No Drawings

IMAGING ELEMENT FOR MAKING AN IMPROVED PRINTING PLATE ACCORDING TO THE SILVER SALT DIFFUSION TRANSFER PROCESS

DESCRIPTION

Benefit is claimed under 35 U.S.C. 119(B) from provisional application 60/026,778 filed Sep. 29, 1996.

1. Field of the Invention

The present invention relates to an imaging element, for making improved lithographic printing plates according to the silver salt diffusion transfer process.

The present invention further relates to a method for making improved lithographic printing plates according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development the imaged element is used as a printing plate without the removal of the emulsion layer.

According to a second type of mono-sheet DTR offset printing plate a hydrophilic support, mostly anodized aluminum, is provided in the order given with a layer of physical development nuclei and a silver halide emulsion layer. After information-wise exposure and development the imaged element is treated to remove the emulsion layer so that a support carrying a silver image is left wich is used as a printing plate. Such type of lithographic printing plate is disclosed e.g. in U.S. Pat. No. 3,511,656.

As for other printing plates it is required that the offset printing plates belonging to the second type of mono-sheet DTR offset printing plates have good printing properties e.g. a high printing endurance, good ink acceptance in the printing areas and no ink acceptance in the non-printing areas (no staining). It is furthermore required that the printing plate exhibits a high resolving power and good physical properties.

Offset printing plates belonging to the second type of mono-sheet DTR offset printing plates have in most respects good printing properties. However, their printing plate precursors exhibit poor physical properties. In order to avoid an unwanted increase in photographic sensitivity when storing the printing plate precursors of said printing plate these printing plate precursors have to be packed with paper interleaves what is a supplemental cost and causes problems in the automatic processing of said printing plate precursors. Furthermore the handling of the unprocessed material results in fingerprint marks on said material which marks show up on the processed material as places with a reduced or zero silver yield and thus a reduced or zero ink acceptance on these places.

Said problems can be partially resolved by applying in the printing plate precursor in a top layer overlying the emulsion layer a matting agent. However there is still room for improvement.

SUMMARY OF THE INVENTION

It is an object of the present invention to provide an imaging element for making offset printing plates according to the silver salt diffusion transfer process which is not sensitive to fingerprints.

It is still another object of the present invention to provide an imaging element for making offset printing plates according to the silver salt diffusion transfer process which can be packed without paper interleaves without marked sensitivity changes when storing said imaging element.

It is a further object of the present invention to provide a method for making offset printing plates with said imaging element having the above mentioned advantages.

Further objects of the present invention will become clear from the description hereinafter.

According to the present invention there is provided an imaging element comprising in the order given on a hydrophilic surface of a support (i) an image receiving layer containing physical development nuclei, (ii) a photosensitive layer containing a silver halide emulsion being in water permeable relationship with said image receiving layer (iii) a first antistress layer and (iv) a second antistress layer, said antistress layers being in water permeable relationship with said image receiving layer and each independently comprising gelatin, characterized in that said second antistress layer comprises at least 30 mg/m$^2$ of a matting agent with a weight average diameter of more than 3 μm.

According to the present invention there is also provided a method for making an offset printing plate according to the silver salt diffusion transfer process comprising the steps of:

(a) image-wise exposing an imaging element according to the present invention, (b) applying an aqueous alkaline solution to the imaging element in the presence of (a) developing agent(s) and (a) silver halide solvent(s), (c) treating the imaging element to remove the layer(s) on top of said image receiving layer, thereby uncovering said silver image formed in said image receiving layer.

DETAILED DESCRIPTION OF THE INVENTION

Lithographic printing plates are obtained according to the DTR-process having good printing properties from imaging elements having good physical and photographic properties by using an imaging element comprising two upper layers (antistress layers) comprising gelatin when said second antistress layer comprises at least 30 mg/m² of a matting agent with a weight average diameter of more than 3 µm.

EP-A-637777 discloses an imaging element comprising in the order given (i) a hydrophilic base, (ii) an image receiving layer containing physical development nuclei and (iii) a photosensitive layer containing a silver halide emulsion being in water permeable relationship with said image receiving layer, characterized in that at least one gelatin comprising layer contains at least one gelatin species whereof a 10% by weight aqueous solution at 36° C. and pH 6 has a viscosity lower than 20 mPa•s at a shearing rate of 1000 s⁻¹. Said document does not disclose the presence of an antistress layer and is not concerned with the objects of the present application.

EP-A-679938 discloses a method for producing a silver halide photographic light-sensitive material. The silver halide photographic light-sensitive material comprises a support having thereon photographic layers including a silver halide emulsion layer, a first hydrophilic colloid layer and an outermost second hydrophilic colloid layer in this order from the support. The upper sublayer had a matting agent incorporated therein. Said patent does not describe a DTR-material and is not concerned with the objects of the present application.

EP-A-567178 describes a method for treating a grained and anodized aluminum support, suitable for use as support for a DTR-material. Said patent does not disclose the use of an antistress layer and is not concerned with the objects of the present application.

JP-A-01/261643 discloses a lithographic printing material. Said material comprises matting agents in the undercoat layer.

JP-A-08/015811 discloses a photographic material formed by coating a support with a silver halide emulsion and a hydrophilic colloidal layer formed by coating the silver halide emulsion with a hydrophilic colloid. The outermost hydrophilic colloid layer is formed by applying a hydrophilic colloid containing a matting agent of 4–50 µm grain diameter in an amount of 4–50 mg/m². Said material is not a DTR-material and is not concerned with the objects of the present application.

JP-A-61/048851 discloses a photosensitive material for silver salt diffusion transfer process comprising a silver halide emulsion on a base and an uppermost layer including a matting agent. This material is a two-sheet DTR-element, does not disclose the presence of two antistress layers and is not concerned with the objects of the present application.

JP-A-02/115832 a silver halide photographic sensiyive material wherein a matting agent is added to both of the silver halide emulsion layer and the backing layer. Said material does not contain a antistress layer, let alone two antistress layers and is not a DTR-material.

JP-A-07/287342 discloses a photosensitive material which has at least one silver halide emulsion layer and one nonphotosensitive colloidal layer on a support and at least one of the nonphotosensitive colloidal layers farthest from the support contains a mono-dispersed matting agent. Said material is not a DTR-material and said disclosure is not concerned with the objects of the present application.

DE-A-1447900 discloses a two-sheet DTR-element for obtaining lithographic plates. Said material is not a monosheet DTR-element, does not contains an antistress layer with a matting agent and is not concerned with the object of the present application.

According to the invention said matting agent may be a water-insoluble, alkali soluble organic polymer or copolymer such as a copolymer of acrylic acid and methyl acrylate. More preferably said matting agent is a water insoluble inorganic compound such as silica. Most preferably said matting agent is an alkali-insoluble organic polymer or copolymer such as a polymer or copolymer of methyl (meth)acrylate. A particularly preferred matting agent is a copolymer of styrene, methyl methacrylate and maleic acid.

According to the invention the matting agent has a weight average diameter of more than 3 µm, more preferably of more than 4 µm, most preferably of at least 5 µm. The maximum weight average diameter is not so important but is for practical reasons preferably less than 15 µm, more preferably less than 10 µm.

According to the invention said second antistress layer comprises at least 30 mg/m² of a matting agent with a weight average diameter of more than 3 µm, more preferably between 50 and 500 mg/m² of said matting agent, most preferably between 100 and 200 mg/m² of said matting agent.

According to the invention said first antistress layer comprises preferably less than 50 mg/m² of a matting agent with a weight average diameter of more than 3 µm, more preferably less than 10 mg/m² of said matting agent, most preferably none of said matting agent.

According to the invention the first and the second antistress layer each independently comprises preferably unhardened gelatin or gelatin admixture preferably in an amount between 0.1 and 3 g/m², more preferably in an amount between 0.2 and 2 g/m². The total amount of unhardened gelatin in the first and the second antistress layers is preferably between 0.3 and 3.5 g/m², more preferably between 0.6 and 1.75 g/m², most preferably between 0.8 and 1.25 g/m².

Preferably at least 50%, more preferably at least 75%, most preferably at least 90% by weight of said unhardened gelatin or gelatin admixture belongs to one or more gelatin species whereof a 10% by weight aqueous solution at 36° C. and pH 6 has a viscosity lower than 35 mPa•s, more preferably lower than 30 mpa•s at a shearing rate of 1000 s⁻¹.

Said antistress layers can comprise more than one species of unhardened gelatin whereof a 10% by weight aqueous solution at 36° C. and pH 6 has a viscosity lower than 35 mPa•s at a shearing rate of 1000 s⁻¹, but it is preferred for practical reasons that said layers comprise only one such gelatin.

Said antistress layers may contain small particles e.g. matting agents with a mean diameter between 0.2 and 3 µm in order to improve the diffusion of processing solutions through said antistress layers.

There can be more than one layer between the emulsion layer and the second antistress layer, but for practical reasons it is preferred that there is only one layer between the emulsion layer and the second antistress layers i.e. the first antistress layer. The second antistress layer is the surface layer of the imaging element lying on that side of the support that carries the emulsion layer. The first antistress layer is the layer contiguous to the second antistress layer.

The antistress layers according to the invention have to be in water permeable relationship with said image receiving layer in the imaging element. Layers being in waterpermeable contact with each other are layers that are contiguous to each other or only separated from each other by (a) water-permeable layer(s). The nature of a waterpermeable layer is such that it does not substantially inhibit or restrain the diffusion of water or of compounds contained in an aqueous solution e.g. developing agents or the complexed silver.

The imaging element is preferably prepared by coating the different layers on a hydrophilic surface of a support. Alternatively the different layers may be laminated to said image receiving layer from a temporary base holding the layers in reverse order as disclosed in U.S. Pat. No. 5,068, 165.

Said hydrophilic surface of a support can be a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

Flexible supports may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide.

Said hydrophilic surface of a support is preferably a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1.5 µm, an anodization layer with a thickness between 0.4 and 2.0 µm and is posttreated with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

After roughening and optional chemical etching the aluminum foil is anodized which may be carried out as follows.

An electric current is passed through the grained aluminum foil immersed as an anode in a solution containing an acid. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ $Al_2O_3.H_2O$. The anodized aluminum foil may subsequently be rinsed with demineralised water within a temperature range of 10°–80° C.

The anodization is preferably executed in such a way that the rear side of the aluminum foil (the side of the aluminum foil which will not be coated with the emulsion layer) also carries an anodization layer with a weight of at least 0.5 g/m$^2$ of $Al_2O_3.H_2O$ and at most a weight equal to the weight of $Al_2O_3.H_2O$ on the front side. This amount of $Al_2O_3.H_2O$ on the rear side can be controlled by the protection with an isolator of the rear side of the aluminum foil against electrical loss-currents.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

The rear side of the aluminum foil can also be coated with a layer comprising an organic polymer or copolymer. This can be a hydrophilic polymer or copolymer such as poly acrylic acid, polyvinyl alcohol, dextranes, dextrines, pullulan, cellulose and derivatives, polyvinyl pyrrolidone etc. This can also be a hydrophobic polymer or copolymer such as polystyrene, poly(meth)acrylates, polyesters, polyolefins etc.

Subsequent to the preparation of the hydrophilic layer of a support as described above, said hydrophilic layer may be immediately coated with a solution containing the physical development nuclei or may be coated with said solution at a later stage.

The image receiving layer preferably comprises physical development nuclei in an amount ranging from 0.1 mg to 20 mg/m$^2$. The image receiving layer containing physical development nuclei may be free of hydrophilic binder but preferably comprises small amounts upto 80% by weight of the total weight of said layer of a hydrophilic colloid e.g. polyvinyl alcohol to improve the hydrophilicity of the surface.

Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 μm, preferably from 0.25 to 0.45 μm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPa•s at a shearing rate of 1000 s$^{-1}$ combined with a gelatin of a higher viscosity. The weight ratio of said low viscosity gelatin versus the gelatin of a higher viscosity is preferably >0.5.

Preferably the gelatin layer(s) is(are) unhardened. Unhardened means that when such gelatin layer is coated on a subbed polyethylene terephtalate film base at a dry thickness of 1.2 g/m$^2$, dried for 3 days at 57° C. and 35% R.H. and dipped in water of 30° C., said gelatin layer is dissolved for more than 95% by weight within 5 minutes.

The silver halide emulsions may contain pH controlling ingredients. Preferably at least one gelatin containing layer is coated at a pH value not below the iso-electric point of the gelatin to avoid interactions between said gelatin containing coated layer and the hereafter mentioned intermediate layers. More preferably the gelatin layer contiguous to said intermediate layer is coated at a pH value not below the iso-electric point of the gelatin. Most preferably all the gelatin containing layers are coated at a pH value not below the iso-electric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

Preferably, the imaging element also comprises an intermediate layer between the image receiving layer on the hydrophilic surface of a support and the photosensitive layer(packet) to facilate the removal of said layer(packet) thereby uncovering the silver image formed in the image receiving layer by processing the imaging element.

In one embodiment, the intermediate layer is a water-swellable intermediate layer coated at a ratio of 0.01 to 2.0 g/m2 and comprising at least one non-proteinic hydrophilic film-forming polymer e.g. polyvinyl alcohol and optionally comprising an antihalation dye or pigment as disclosed in EP-A-410500.

In another embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

In still another embodiment, the intermediate layer is a layer comprising particles of a water insoluble inorganic compound having a number average size not lower than 0.1 μm. Preferably, said intermediate layer comprises said water insoluble inorganic compound in an amount of at least 0.1 g/m$^2$. Further details are disclosed in EP-A-94203779.7

In still another embodiment, the intermediate layer is a layer comprising particles of an alkali insoluble non-polymeric organic compound having a melting point of at least 50° C., said particles having a number average size between 0.1 μm and 10 μm. Preferably, said intermediate layer comprises said alkali insoluble non-polymeric organic compound in an amount of at least 0.1 g/m$^2$. Further details are disclosed in EP-A-95201713.5

In still another embodiment, the intermediate layer is a layer comprising particles of an alkali insoluble polymeric organic compound obtainable by polycondensation, said particles having a number average size between 0.02 μm and 10 μm. Preferably, said intermediate layer comprises said alkali insoluble polymeric organic compound obtainable by polycondensation in an amount of at least 0.1 g/m$^2$. Further details are disclosed in EP-A-95203052.6.

All said intermediate layers may comprise pigment particles with a number average diameter between 0.2 and 1 μm such as $CaCO_3$, $TiO_2$, $BaSO_4$, $Al_2O_3$, $SiO_2$, $ZnO_2$, etc.

A supplemental intermediate layer, which may be present between said silver halide emulsion containing layer and said intermediate layer may incorporate one or more ingredients such as i.a. antihalation dyes or pigment, developing agents, silver halide solvents, base precursors, and anticorrosion substances.

When the imaging element is prepared by laminating a layer packet comprising a photosensitive layer onto the image receiving layer the intermediate layer(s) are provided on the photosensitive layer(s), the intermediate layer being the upper layer.

According to the present invention the imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

According to the present invention the development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of (a) developing agent(s), and (a) silver halide solvent(s). The developing agent(s) and/or the silver halide solvent(s) can be incorporated in the aqueous alkaline solution and/or in the imaging element.

Preferably a silver halide solvent in the aqueous alkaline solution is used in an amount between 0.05% by weight and 5% by weight and more preferably between 0.5% by weight and 2% by weight. The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

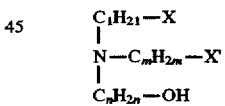

wherein X and X' independently represent hydrogen, a hydroxyl group or an amino group, l and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

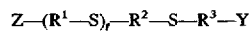

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 554,585.

Still further suitable silver halide solvents are 1,2,4-triazolium-3-thiolates, preferably 1,2,4-triazolium-3-thiolates substituted with at least one substituent selected from the group consisting of a $C_1$–$C_8$ alkyl group that contains at least 3 fluorine atoms, a $C_4$–$C_{10}$ hydrocarbon group and a 4-amino group substituted with a $C_1$–$C_8$ alkyl group that contains at least 3 fluorine atoms and/or a $C_4$–$C_{10}$ hydrocarbon group.

Combinations of different silver halide solvents can be used and it is also possible to incorporate at least one silver halide solvent into a suitable layer of the imaging element and to add at least one other silver halide solvent to the developing solution.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used.

Preferred amounts of the hydroquinone-type developing agents are in the range of 0.05 mole to 0.40 mole per liter and preferred amounts of secondary developing agent(s) in the range of $1.8 \times 10^{-3}$ to $2.0 \times 10^{-1}$ mole per liter.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image receiving layer. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 2-mercapto-5-heptyl-oxa-3,4-diazole and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per liter and preferably in admixture with 1-phenyl-5-mercaptotetrazole, the latter compound may be used in amounts of e.g. 50 mg to 1.2 g. per liter of solution, which may contain a minor amount of ethanol to improve the dissolution of said compounds.

The aqueous alkaline solution may comprise other ingredients such as e.g. oxidation preservatives, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range from 5 to 7.

Buffered stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C. and in a time from 5 s to 5 min.

After formation of the silver image on the hydrophilic surface of a support an excess of aqueous alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is preferably between 30° C. and 50° C., more preferably between 35° C. and 45° C.

The imaged surface of the hydrophilic surface of a support can be subjected to a chemical treatment that increases the hydrophilicity of the non-silver image parts and the oleophilicity of the silver image.

This chemical after-treatment is preferably carried out with a lithographic composition often called finisher comprising at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

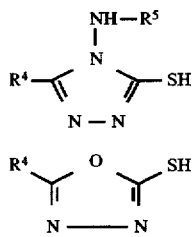

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acidic polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyglycols being the reaction products of ethyleneoxide and/or propyleneoxide with water or an alcohol and polyvinyl alcohol. Optionally, hygroscopic substances e.g. sorbitol, glycerol, tri(hydroxyethyl)ester of glycerol, and turkish red oil may be added.

Furthermore (a) surface-active compound(s) is preferably also added to the finisher. The concentration thereof may vary within broad ranges provided the finisher shows no excessive degree of foaming when plates are finished. Preferred surface-active compound are anionic or non-ionic surface-active compound.

A suitable finisher as disclosed in U.S. Pat. No. 4,563,410 is a composition comprising a solution of a mercaptotriazole in a solution of polyethylene oxide with a molecular weight of 4,000. Further suitable finishers have been described in i.a. U.S. Pat. No. 4,062,682 and EP-A 681219.

At the moment the treatment with the finisher is started the surface carrying the silver pattern may be in dry or wet state. In general, the treatment with the finisher does not take long, usually not longer than about 30 seconds and it may be carried out immediately after the processing and uncovering steps, preferably at a temperature of the finisher in the range from 30° C. to 60° C.

The finisher can be applied in different ways such as by rubbing with a roller, by wiping with an absorbent means e.g. with a plug of cotton or sponge, or by dipping the material to be treated in the finisher. The image-hydrophobizing step of the printing plate may also proceed automatically by conducting the printing plate through a device having a narrow channel filled with the finisher and conveying the printing plate at the end of the channel between two squeezing rollers removing the excess of liquid.

As soon as the hydrophilic surface of a support carrying the silver image has been treated with the finisher, it is ready to be used as a printing plate.

The following example illustrates the present invention without however, limiting it thereto. All parts, percentages and ratios are by weight unless otherwise indicated.

EXAMPLE 1

A 0.30 mm thick aluminium foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness Ra of 0.6 µm. The aluminium plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film on the front side of 3.0 g/m² of $Al_2O_3.H_2O$ and on the rear side of 0.3 g/m² of $Al_2O_3.H_2O$, treated with an aqueous solution containing 20 g/l of $NaHCO_3$ at 45° C. for 30 sec and then rinsed with demineralised water and dried.

The imaging element I was obtained by coating the grained, anodized and posttreated aluminum support with a silver-receptive stratum containing 4 mg/m² $Ag°$ as physical development nuclei.

An intermediate layer was then provided on the dry silver-receptive stratum from an aqueous composition of pullulan and Levanyl Rot (trade name of Bayer A. G. for a red pigment) in such a way that the resulting dried layer had a weight of 120 mg of pullulan and 250 mg of Levanyl Rot per m².

Subsequently a substantially unhardened photosensitive negative-working cadmium-free gelatin silver chloroiodide emulsion layer (99.8/0.2 mol %) containing 1 mmole/mole AgX of 4-hydroxy-6-methyl-1,3,3a,7-tetraazaindene and 2.2 mole/mole AgX of 1-(3-(2-sulphobenzamido))phenyl-5-mercapto-tetrazole was coated on the intermediate layer, the silver halide being provided in an amount corresponding to 2.50 g of silver nitrate per m² and the gelatin content of the emulsion layer being 1.50 g/m², consisting of 0.7 g/m² of a gelatin with a viscosity of 21 mPas and the remainder of a gelatin with a viscosity of 14 mPas.

Finally the photosensitive emulsion layer was overcoated with an antistress layer containing no hardeners comprising 1.05 g/m² gelatin with a viscosity of 10–12 mPas (gelatin K 7598 of Koepff), and 60 mg/m² of Levanyl Rot. Imaging element I was so obtained.

Imaging element II was obtained in an identical way as imaging element I with the exception that the antistress layer also comprised 140 mg/m² of a copolymer of styrene, methyl methacrylate and maleic acid as matting agent with a weight average diameter of 7 µm.

Imaging element III was obtained in an identical way as imaging element II with the exception that the photosensitive emulsion coating was overcoated with a first antistress layer containing no hardeners comprising 0.70 g/m² gelatin with a viscosity of 10–12 mPas (gelatin K 7598 of Koepff) and 60 mg/m² of Levanyl Rot but no silica matting agent. The first antistress layer was finally overcoated with a second antistress layer containing no hardeners comprising 0.35 g/m² gelatin with a viscosity of 10–12 mPas (gelatin K 7598 of Koepff) and 140 mg/m² of silica with a weight average diameter of 7 µm.

Imaging element IV was obtained in an identical way as imaging element III with the exception that the rear side of the aluminum foil contained 0.7 g/m² of $Al_2O_3.H_2O$.

From each of the imaging elements half of the samples were packed without interleaves in a air-tight bag at 20° C. and 40% R.H. and stored for 5 days at 57° C. and 34% R.H.

A fresh and a stored sample of the various imaging elements were placed in contact with a test target having lines of dots having the same size in one line and having dots of different sizes in different lines and exposed therethrough in a process-camera. In the next step each imaging element was immersed for 10 s at 24° C. in a freshly made developing solution having the following composition:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-4-methyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 20 s to form a silver image in the image receiving layer.

To remove the developed silver halide emulsion layer and the intermediate layer from the aluminium foil the developed monosheet DTR materials were rinsed for 5 s with a water jet at 40° C. in a LP 82 (tradename of a processor marketed by Agfa-Gevaert, Belgium).

Next, the imaged surfaces of the aluminium foils were treated in a LP 82 (marketed by Agfa-Gevaert, N.V. of Belgium) for 15 s with a finisher at 45° C. to enhance the water-receptivity of the non-image areas and to make the image areas oleophilic ink-receptive. The finisher had the following composition:

| | |
|---|---|
| Gebo (trade mark for a surfactant sold by Chemische Fabrik Chem-Y, Gmbh, Germany) | 250 mg |
| polyethylene glycol 3000 | 75 g |
| potassium nitrate | 12.5 g |
| citric acid | 20.0 g |
| 2-mercapto-5-heptyl-oxa-3,4-diazole | 2.0 g |
| $NaH_2PO_4.2H_2O$ | 20.0 g |
| 5-bromo-5-nitro-1,3-dioxane | 200 mg |
| sodium hydroxyde | 13.0 g |
| water to make | 1000 ml |
| pH (20° C.) = 5.9 | |

The printing plates thus prepared were used for printing under identical conditions. The printing plates were mounted on the same offset printing machine (HEIDELBERG GTO-46). As fountain solution was used Rotamatic at 50% and as ink K+E 123W from Kast and Ehinger.A. G., Germany. A compressible rubber blanket was used.

The quality of the printing plates was judged by the criteria of tendency for showing fingerprints (A), change in photographic sensitivity by storage for 5 days at 57° C. and 34% R.H. of a package without interleaves, packed at 20° C. and 40% R.H. (B: a positive number means an increase in sensitivity) and visual outlook in regard to lines in the direction of the roller without silver transfer (C). The results are given in table 1.

TABLE 1

| Quality aspect | I | II | III | IV |
|---|---|---|---|---|
| A | very bad | moderate | good | good |
| B | 0.20 log It | 0.10 log It | 0.06 log It | 0.02 log It |
| C | bad | moderate | moderate | good |

It is clear from these results that a printing plate obtained from imaging element I (comparison element) yielded an unacceptable bad result for the tendency to fingerprints and the change in photographic sensitivity on storage. These aspect were improved with printing plates obtained from an imaging element II. These tendency to fingerprints and change in photographic sensitivity on storage was even more improved when printing plates obtained from imaging element III or IV (elements according to the invention) were used. Printing plates obtained from imaging element IV having an anodization layer of 0.7 g/m² on the rear side of the aluminum foil yielded even better results for the aspects change in photographic sensitivity on storage and lines in the direction of the roller without silver transfer than printing plates obtained from imaging element III having an anodization layer of 0.3 g/m² on the rear side of the aluminum foil.

We claim:

1. An imaging element comprising in the order given on a hydrophilic surface of a support (i) an image receiving layer containing physical development nuclei, (ii) a photosensitive layer containing a silver halide emulsion being in water permeable relationship with said image receiving layer (iii) a first antistress layer and (iv) a second antistress layer, said antistress layers being in water permeable relationship with said image receiving layer and each independently comprising unhardened gelatin, wherein said second antistress layer comprises at least 30 mg/m² of a matting agent with a weight average diameter of more than 3 µm.

2. An imaging element according to claim 1 wherein said matting agent is an alkali-insoluble organic polymer.

3. An imaging element according to claim 1 wherein said matting agent has a weight average diameter of at least 5 µm.

4. An imaging element according to claim 1 wherein said second antistress layer comprises between 50 and 500 mg/m² of said matting agent with a weight average diameter of more than 3 µm.

5. An imaging element according to claim 4 wherein said second antistress layer comprises between 100 and 200 mg/m² of said matting agent with a weight average diameter of more than 3 µm.

6. An imaging element according to claim 1 wherein said first antistress layer comprises less than 50 mg/m² of a matting agent with a weight average diameter of more than 3 µm.

7. An imaging element according to claim 1 wherein the first and the second antistress layer each independently comprises unhardened gelatin or gelatin admixture in an amount between 0.1 and 3 g/m².

8. An imaging element according to claim 1 wherein said hydrophilic surface of a support is a grained and anodized aluminum foil.

9. An imaging element according to claim 8 wherein said grained and anodized aluminum foil carries on its side which will not be coated with the emulsion layer an anodization layer with a weight of at least 0.5 g/m$^2$ of $Al_2O_3.H_2O$.

10. A method for making an offset printing plate according to the silver salt diffusion transfer process comprising the steps of:

(a) image-wise exposing an imaging element according to claim 1, (b) applying an aqueous alkaline solution to the imaging element in the presence of (a) developing agent(s) and (a) silver halide solvent(s), (c) treating the imaging element to remove the layer(s) on top of said image receiving layer, thereby uncovering said silver image formed in said image receiving layer.

* * * * *